(12) United States Patent
Schlenga et al.

(10) Patent No.: US 7,310,034 B2
(45) Date of Patent: Dec. 18, 2007

(54) SUPERCONDUCTOR MAGNET COIL CONFIGURATION

(75) Inventors: Klaus Schlenga, Linkenheim-Hochstetten (DE); Volker Niemann, Straubenhardt (DE); Gerhard Roth, Rheinstetten (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 11/214,712

(22) Filed: Aug. 31, 2005

(65) Prior Publication Data

US 2006/0152315 A1 Jul. 13, 2006

(30) Foreign Application Priority Data

Sep. 11, 2004 (DE) ...................... 10 2004 043 989

(51) Int. Cl.
H01F 6/00 (2006.01)
(52) U.S. Cl. .................. 335/216; 505/705; 505/879
(58) Field of Classification Search ........ 505/211–230, 505/704–705, 876–880; 336/DIG. 1; 335/216
See application file for complete search history.

(56) References Cited

U.S. PATENT DOCUMENTS

| 5,138,383 | A | * | 8/1992 | Shiga et al. ................. 335/216 |
|---|---|---|---|---|
| 5,543,768 | A | * | 8/1996 | Murakami et al. .......... 335/216 |
| 5,764,121 | A | * | 6/1998 | Wheatley et al. ........... 335/216 |
| 6,020,803 | A | * | 2/2000 | Wheatley et al. ........... 335/216 |
| 6,624,732 | B2 | | 9/2003 | Biltcliffe |
| 6,753,748 | B1 | * | 6/2004 | Schlenga ..................... 335/216 |
| 6,774,752 | B2 | * | 8/2004 | Schlenga et al. ............ 335/216 |
| 2004/0108924 | A1 | * | 6/2004 | Schlenga ..................... 335/216 |

FOREIGN PATENT DOCUMENTS

| EP | 0 406 862 | 1/1991 |
|---|---|---|
| EP | 0 649 151 | 4/1995 |
| JP | 5335145 | 12/1993 |
| WO | WO97/17710 | 5/1997 |

* cited by examiner

Primary Examiner—Ramon M. Barrera
(74) Attorney, Agent, or Firm—Paul Vincent

(57) ABSTRACT

A superconducting magnet coil configuration has at least one section containing a superconducting strip conductor which is wound in several layers like a solenoid in a cylindrical winding chamber (1) between two end flanges (2, 3), characterized in that the radially innermost layers of the section consist of metallic low-temperature superconductors (LTS) (LTS layers (8)) and radially adjacent layers of the section are formed from high-temperature superconductor (HTS) material (HTS layers (9)). The invention proposes a magnet coil configuration using HTS material which has a notch structure for correcting inhomogeneities and homogenizing a compact high-field magnet, wherein the mechanical load on the HTS strip conductor is minimized.

14 Claims, 1 Drawing Sheet

SUPERCONDUCTOR MAGNET COIL CONFIGURATION

This application claims Paris Convention priority of DE 10 2004 043 989.3 filed Sep. 11, 2004 the complete disclosure of which is hereby incorporated by reference.

BACKGROUND OF THE INVENTION

The invention concerns a superconducting magnet coil configuration with at least one section containing a superconducting strip conductor which is wound in a cylindrical winding chamber between two end flanges in several solenoid-like layers.

Magnet coil configurations of this type are known in the art.

Notches are frequently used to homogenize compact high field magnets via field correction of magnet coil configurations having low-temperature superconductors (LTS). A conventional notch region is designed by initially completely winding the first notch winding on one side of the notch. The wire is then bent sharply and guided axially through the notch. The second notch winding is then wound on the other side. LTS coils of this type are either not reacted at all (e.g. for use of NbTi superconductors) or are produced in a "wind-and-react" method. In the latter case, the coil is already wound into its final shape with a mechanically insensitive initial filament structure which, in the wound state, is subjected to an annealing process in an atmosphere containing little oxygen. A solid state diffusion procedure is performed during the annealing process to produce the superconducting material (e.g. $Nb_3Sn$). This superconducting material is extremely brittle following the solid state diffusion reaction and cannot be deformed.

The highest field strengths are obtained by using strip conductors of high-temperature superconducting (HTS) material in the innermost magnet coil windings. HTS conductors require a defined oxygen atmosphere during the annealing process. The annealing process is therefore performed before the superconducting wire is wound. The coil is then wound from strip conductors which are already superconducting ("react-and-wind" method). Due to the high mechanical sensitivity of these strip conductors, the notches cannot be conventionally designed in this region. In particular, transfer of the strip conductor from one side of the notch to the other side using the above-described sharp bend and the associated small radius of curvature is not possible with an HTS strip conductor. The mechanical sensitivity of HTS strip conductors is particularly problematic in view of forming a notch region in a magnet coil configuration since damage to the HTS conductor material would result in a costly defect in the overall magnet coil configuration. Undesired inhomogeneities in HTS coils must therefore be compensated for using separate correction coils.

It is therefore the underlying purpose of the invention to propose a magnet coil configuration using HTS material which has a notch structure for correcting inhomogeneities, wherein the mechanical load on the HTS strip conductor is minimized.

SUMMARY OF THE INVENTION

This object is achieved in a surprisingly simple manner in that the radially innermost layers of the section consist of metallic low-temperature superconductors (LTS) (LTS layers) and radially bordering layers of the section are formed from high-temperature superconducting (HTS) material (HTS layers).

In contrast to the conventional HTS coils, the present invention also proposes use of LTS material in high magnetic fields of the magnet coil configuration. This would initially appear to make no sense, since LTS wire is not well suited for use in high fields due to its poor current carrying capacity. This problem can be solved by using correspondingly thicker but fewer LTS wires which can be used for a notch winding.

In a preferred embodiment of the inventive magnet coil configuration, the radially innermost LTS layers of the section have an axial region of reduced current density (notch region). The invention thereby utilizes the high current carrying capacity of HTS conductors and the associated high achievable field strengths to construct a high field magnet, while utilizing the mechanical insensitivity of the initial filament structure of an LTS superconductor to define a notch region. In this manner, it is possible to compensate for inhomogeneities within the magnet coil configuration containing the HTS material without additional compensation coils.

In a particularly preferred embodiment, all HTS layers are continuously wound between the two end flanges. The HTS layers extend radially outside of the notch region and are merely limited by the end flanges defining the winding chamber. The HTS conductor is not guided through a separating body or the like which would involve bending of the strip conductor through a small radius of curvature.

The LTS layers are preferably produced in a wind-and-react method, wherein the LTS layers are wound with a mechanically insensitive initial filament structure of an LTS wire. The LTS layers can consist e.g. of an A15 superconductor, in particular, having $Nb_3Sn$.

The HTS layers are preferably produced in a react-and-wind method, since production of HTS material requires a defined oxygen atmosphere.

HTS layers containing silver-stabilized Bi—Sr—Ca—Cu oxide or YBCO are particularly suited for use in magnet coil configurations.

In a preferred embodiment of the inventive magnet coil configuration, a protective layer of fiber glass material, PTFE or similar materials is disposed between the LTS layers and the HTS layers to protect the sensitive LTS layers from mechanical damage.

The superconducting strip conductor used for the windings is preferably constructed from stacked conductor strips which are electrically connected in parallel. Since one single conducting strip cannot carry sufficient current for the desired applications, the current carrying capacity of the strip conductor winding is thereby increased.

The inventive magnet coil configuration is preferably superconductingly short-circuited to freeze a magnetic flux.

The inventive magnet coil configuration is preferably a high field NMR magnet in the center of which an extremely homogeneous magnetic field is generated.

Further advantages of the invention can be extracted from the description and the drawing. The features mentioned above and below may be used either individually or collectively in arbitrary combination. The embodiments shown and described are not to be understood as exhaustive enumeration but have exemplary character for describing the invention.

DESCRIPTION OF THE PREFERRED EMBODIMENT

Figure 1:
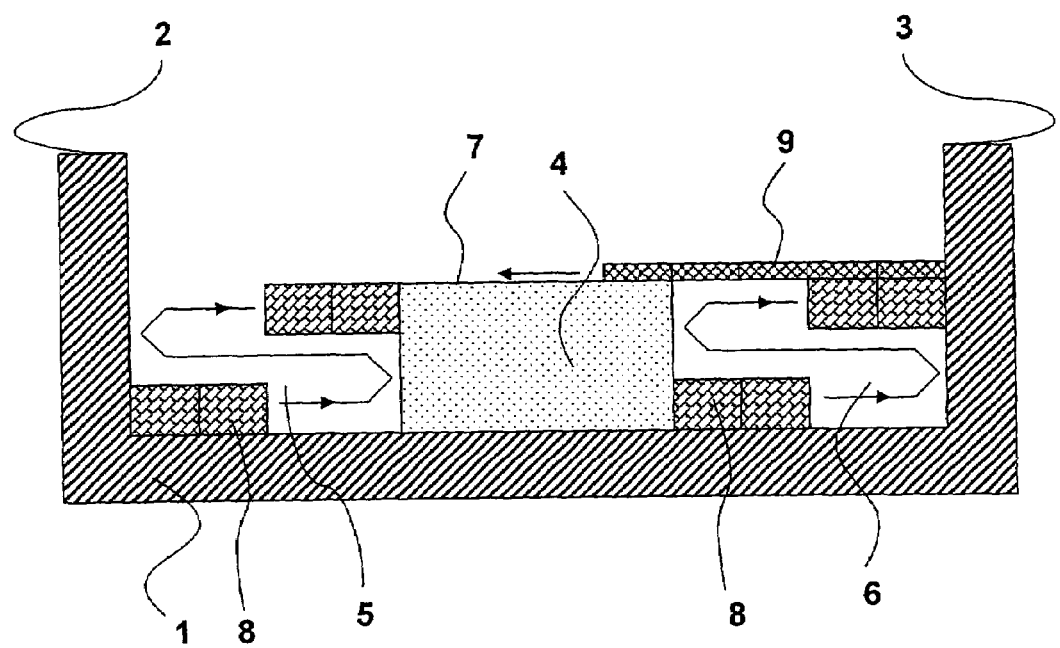
FIG. 1 shows a schematic view of an inventive magnet coil configuration.

FIG. 1 shows a magnet coil configuration having a winding chamber 1 which is limited by two end flanges 2, 3 and is divided into two partial chambers 5, 6 by a separating body 4. The separating body 4 forms a notch region 7 which is directly supported on the winding chamber 1. This is advantageous since the inner windings of a magnet coil have the greatest influence on formation of the field. The separating body 4 can be designed in one piece with the winding chamber 1, e.g. be milled. Alternatively, it may be screwed or fastened in a different manner in the winding chamber 1. The partial chambers 5, 6 are provided with windings of LTS wire 8 (LTS layers) which are generated using a wind-and-react method. Further windings of an HTS strip conductor 9 (HTS layers) are disposed on the LTS layers and the separating body 4, and permit use of the inventive magnet coil configuration for high-field applications due to their high current-carrying capacity. Since, however, compared to HTS conductors, LTS conductors only have a small current-carrying capacity in correspondingly high magnetic fields, a relatively thick LTS wire 8 must be used for the present field forming application. The magnet coil configuration is therefore thicker in the inner region where the notch region is structured, which is generally not desirable. For this reason, LTS conductors have not been used in high magnetic fields up to now. However, since only a few layers are involved, the larger thickness of the LTS wire can be neglected in the overall magnet coil configuration. A mixed joint (not shown) connects the transition between the windings of the LTS wire 8 and of the HTS strip conductor 9. The windings of LTS wire 8 and the windings of the HTS strip conductor 9 are only shown in FIG. 1 at single selected points for reasons of clarity. The meandering line provided with arrows indicates the further extension of the windings of the LTS wire 8. The arrows point in a direction which extends almost perpendicularly to the longitudinal axis of the LTS wire 8.

Figure 2:
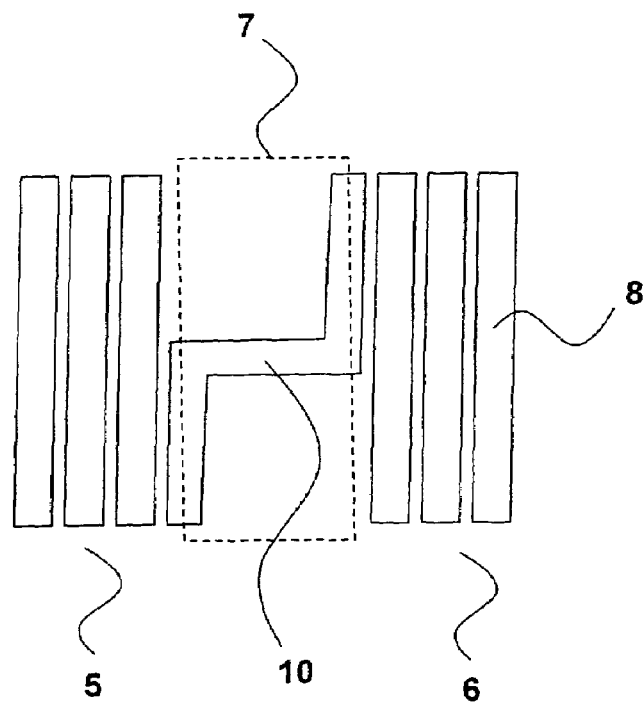
FIG. 2 shows a schematic view of the dependence of the LTS windings of a magnet coil configuration in accordance with the present invention.

FIG. 2 shows the winding dependence of the LTS wire forming the notch region 7. The windings of the LTS wire 8 extend initially in the first partial chamber 5 up to the height of the upper edge of the separating body 4 and then merge into a transition 10 through the separating body 4 and into the second partial chamber 6. The LTS wire 8 is wound like a solenoid in the second partial chamber 6, analogous to the first partial chamber 5. When the LTS wire 8 is transferred from the first partial chamber 5 into the second partial chamber 6 of the magnet coil configuration, the LTS wire 8 is bent through 90° and is directly guided to the lowermost winding of the second partial chamber 6 where the LTS wire 8 is bent again. As in conventional LTS coils, the LTS wire 8 is transferred within the separating body 4 substantially perpendicularly to the windings. A transfer of this type would not be possible with HTS conductors since HTS conductors are very brittle and are usually present in the form of strip conductors 9. The required bending should be effected via the narrow edge of the strip conductor 9. As mentioned above, the present invention therefore realizes the notch region 7 of the magnet coil configuration containing HTS material and the transfer 10 required therefor using an LTS wire 8. This is straightforward to effect, since the notch winding and the transition 10 are formed using the mechanically insensitive initial filament structure of the LTS wire 8. The current density in the inventive LTS wire 8 windings and also in pure LTS coils can be modulated in the different layers. All variations known from conventional LTS coils can be realized in the LTS layers 8 of the inventive magnet coil configuration.

One obtains an overall magnet coil configuration for use as a high field magnet coil having a notch region for field correction, wherein the notch region 7 is designed from windings of mechanically insensitive metallic superconductor. The proposed construction of the magnet coil configuration therefore advantageously facilitates handling of the LTS materials with respect to forming the notch region 7.

The magnet coil configuration therefore permits construction of a notch region within a superconducting magnet coil configuration containing HTS material and therefore homogenization of a compact high-field magnet.

LIST OF REFERENCE NUMERALS

1 winding chamber
2 end flange
3 end flange
4 separating body
5 first partial chamber
6 second partial chamber
7 notch region
8 LTS layers
9 HTS layers
10 transfer

We claim:

1. A superconducting magnet coil configuration comprising:
    at least one section containing a superconducting strip conductor which is wound in several layers like a solenoid in a cylindrical winding chamber between two end flanges, radially innermost layers of said section comprise metallic low-temperature superconductors (LTS) and radially outer layers of said section comprise high-temperature superconductor material (HTS).

2. The magnet coil configuration of claim 1, wherein said radially innermost LTS layers of said section have an axial region of reduced current density defining a notch region.

3. The magnet coil configuration of claim 1, wherein all HTS layers are continuously wound between said two end flanges.

4. The magnet coil configuration of claim 1, wherein said LTS layers are produced in a wind-and-react method.

5. The magnet coil configuration of claim 1, wherein said LTS layers comprise an A15 superconductor.

6. The magnet coil configuration of claim 5, wherein said LTS layers contain $Nb_3Sn$.

7. The magnet coil configuration of claim 1, wherein said HTS layers are produced in a react-and-wind method.

8. The magnet coil configuration of claim 1, wherein said HTS layers contain silver-stabilized Bi—Sr—Ca—Cu oxide.

9. The magnet coil configuration of claim 1, wherein said HTS layers contain YBCO.

10. The magnet coil configuration of claim 1, further comprising a protective layer disposed between said LTS layers and said HTS layers to protect said LTS layers from mechanical damage.

11. The magnet coil configuration of claim 10, wherein said protective layer contains at least one of fiber glass material and PTFE.

12. The magnet coil configuration of claim 1, wherein said superconducting strip conductor is formed from stacked conductor strips which are electrically connected in parallel.

13. The magnet coil configuration of claim 1, wherein the magnet coil configuration is superconductingly short-circuited.

14. The magnet coil configuration of claim 1, wherein the magnet coil configuration is a high field NMR magnet in a center of which an extremely homogeneous magnetic field is generated.

* * * * *